United States Patent [19]

Lathlaen

[11] 4,189,674
[45] Feb. 19, 1980

[54] SIGNAL TRANSDUCING MEANS USING A BISTABLE MAGNETIC DEVICE

[75] Inventor: Richard A. Lathlaen, Hatfield, Pa.
[73] Assignee: TRW Inc., Cleveland, Ohio
[21] Appl. No.: 925,374
[22] Filed: Jul. 17, 1978
[51] Int. Cl.$^2$ ........................................... G01R 33/00
[52] U.S. Cl. .................................. 324/208; 336/134; 336/135
[58] Field of Search .................. 360/60, 140, 111; 324/173, 207, 208, 226, 228, 234, 235, 239, 262; 323/51, 90; 340/195–197; 336/134, 135

[56] References Cited

U.S. PATENT DOCUMENTS

| | | | |
|---|---|---|---|
| 3,366,874 | 1/1968 | Kühne | 324/207 |
| 3,742,409 | 6/1973 | Santis et al. | 324/207 |
| 3,757,754 | 9/1973 | Wiegand | 123/148 E |
| 3,780,313 | 12/1973 | Wiegand | 307/106 |
| 3,818,465 | 6/1974 | Wiegand | 340/174 ZB |
| 3,820,090 | 6/1974 | Wiegand | 340/174 ZB |
| 3,866,193 | 2/1975 | Wiegand | 340/174 ZB |
| 3,892,118 | 7/1975 | Wiegand | 340/174 ZB |

OTHER PUBLICATIONS

W. Tompkins, "Position Indicator", May 1967, I.B.M. Technical Disclosure Bulletin, vol. 9, No. 12, p. 1701.
M. J. Sinko, "Applying the Wiegand Effect to Your Design", 1978, Paper Presented at D.E.C. 78, pp. 1–9.
Philip E. Wigen, "Wiegand Wire: New Material for Magnetic-Based Devices", Jul. 10, 1975, Electronics, pp. 100–105.
"Wiegand Effect A New pulse–Generating Option", Feb. 1978, Automotive Engineering, vol. 86, No. 2, pp. 44–48.
"Wiegand Pulses Break Through into New Applications", Canadian Controls and Instrumentation, Dec. 1977, pp. 16–19.
D. J. Marks, et al., "The Wiegand Effect and its Applications", Tech. Paper 780208, Congress & Exposition of Society of Automotive Engineers, Mar. 1978.
"The Wiegand Effect from Echlin", Oct. 1978, Echlin Manufacturing Company, Branford, Conn. 06405.

Primary Examiner—Rudolph V. Rolinec
Assistant Examiner—Walter E. Snow
Attorney, Agent, or Firm—Jacob Trachtman

[57] ABSTRACT

A signal transducing means for receiving input signals and delivering output signals comprising a bistable magnetic device which alters its magnetic state when the density of magnetic flux to which it is subject passes through a predetermined value, and detecting means providing an output signal responsive to a change in magnetic state of the bistable device. A conducting means for magnetic flux subjects the bistable magnetic device to conducted magnetic flux and comprises a first portion providing a path of high permeability and a second portion providing a path having a permeance which is alterable in response to input signals for varying the reluctance of the conducting means and the density of magnetic flux to which said bistable device is subject. An energizing means provides an alternating magnetic field which induces magnetic flux in the conducting means and provides a flux density which varies through the predetermined value for altering the state of the bistable device to provide an output signal by the detecting means which is controlled by the variation of reluctance of the conducting means. A signal processing means which receives signals from the energizing means and from the detecting means provides output signals responsive to the received input signals.

25 Claims, 9 Drawing Figures

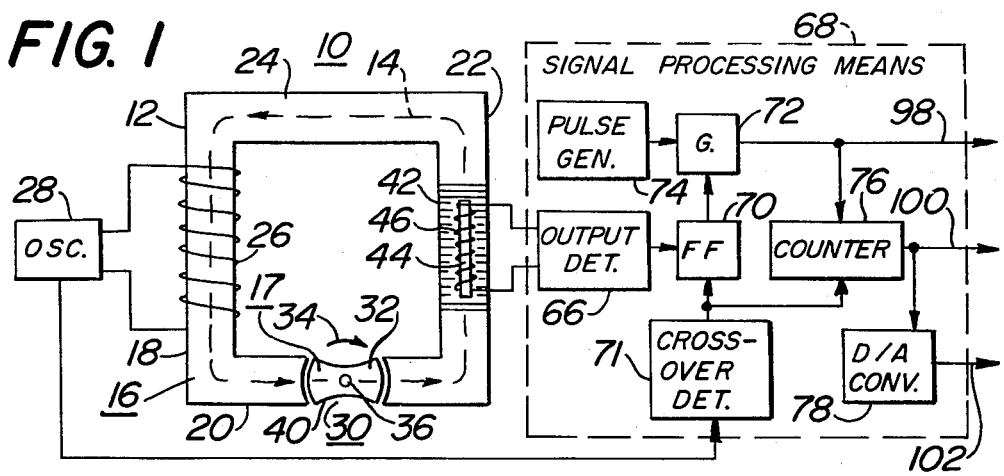
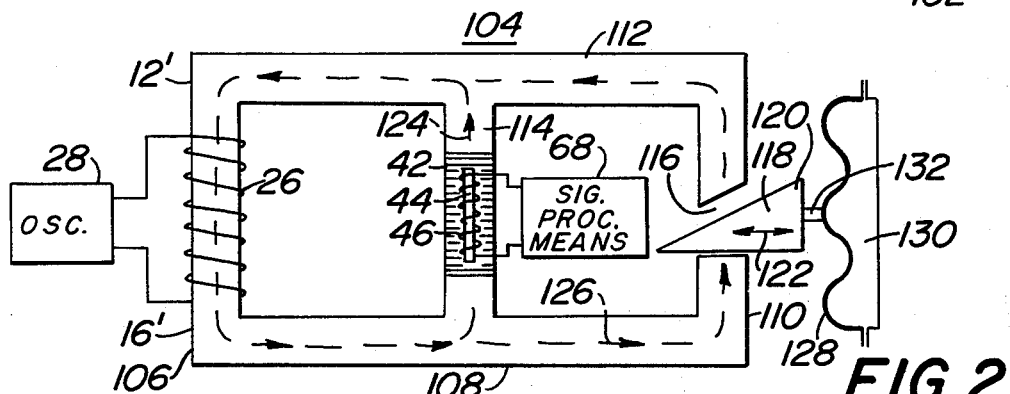
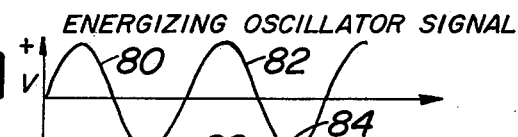
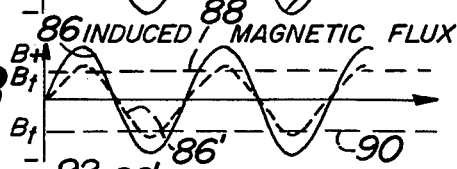
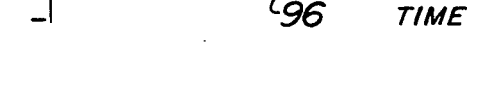
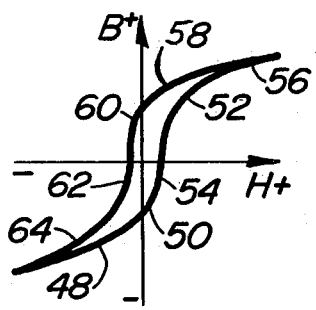

SIGNAL TRANSDUCING MEANS USING A BISTABLE MAGNETIC DEVICE

The invention relates to a signal transducing means, and more particularly to a signal transducing means receiving an input signal and delivering an electrical digital or analog signal in response thereto.

Signal transducers or sensors have been provided for converting an input signal into an output signal of a different form. A particular type of such transducers or sensors receives a mechanical input signal, and provide in response an output electrical signal such as a voltage or current. The present invention, relates to such transducers providing an electrical output which is controlled by small or large mechanical displacements or rotations which may also be representative of other variables such as temperature, pressure, humidity, force and torque. The signal transducing means of the invention, however, is highly sensitive to position and displacement for providing a highly accurate electrical output signal while requiring a minimum of external conditioning for uses in a variety of applications. The invention also provides an amplified output signal for a small amplitude input signal without requiring additional processing, and provides output signals with forms which are readily usable for digital and analog applications.

It is, therefore, a principal object of the invention to provide new and improved signal transducing means of high sensitivity and accuracy.

Another object of the invention is to provide a new and improved signal transducing means providing an output signal of desirable strength irrespective of the weakness of the input signal.

Another object of the invention is to provide a new and improved signal transducing means for receiving a mechanical signal input and providing an electrical signal output in a form which is suitable for digital or analog processing.

Another object of the invention is to provide a new and improved signal transducing means which is readily adaptable for sensing small or large mechanical displacements or rotations for providing electrical output signals.

Another object of the invention is to provide a new and improved signal transducing means which is highly reliable and readily adaptable for many uses with a minimum of external conditioning.

The above and other objects of the invention are achieved by providing a signal transducing means comprising a bistable magnetic device which alters its magnetic state when the density of magnetic flux to which it is subject passes through a predetermined value, and detecting means which provides an output signal responsive to a change of the magnetic state of the bistable device. A conducting means for magnetic flux subjects the bistable magnetic device to magnetic flux which it conducts and comprises a first portion providing a path of high permeability, and a second portion providing a path having a permeance which is alterable in response to input signals for varying the reluctance of the conducting means and the density of magnetic flux to which the bistable device is subject. An energizing means provides a magnetic field which induces magnetic flux in the conducting means and provides a flux density which varies through the predetermined value for altering the state of the bistable device to provide an output signal by the detecting means.

The path of the second portion of the conducting means includes a movable member adapted for being actuated in response to input signals for varying the reluctance of the conducting means. The energizing means includes an energizing coil wound about the first portion of the conducting means and an energizing source which provides alternating current to the coil with a peak value sufficient for periodically subjecting the bistable device to the predetermined value of flux density for altering its magnetic state and for the detecting means to provide corresponding output signals. A signal processing means which receives signals from the energizing means and from the detecting means provides output signals responsive to the input signals.

One form of the signal transducing means is suitable for use with an energizing means which provides low frequency alternating signals to the coil wound around the first portion of the conducting means. In this case, the first and second portions of the conducting means are arranged to provide a series path for magnetic flux induced by the coil, and the bistable device is subject to magnetic flux in the path of the first portion of the conducting means. Another form of the signal transducing means which is suitable when higher frequency alternating signals are applied by the energizing means to the energizing coil provides the conducting means with a third portion of high permeance. The conducting means in this form provides a first circuit for magnetic flux extending in series through the first and second portions of the conducting means, and a second circuit for magnetic flux extending in series through the first and third portions of the conducting means. The energizing means induces magnetic flux in the first and second circuits of the conducting means with the bistable device being subject to the magnetic flux of the third portion of the second circuit of the conducting means.

The foregoing and other objects of the invention will become more apparent as the following detailed description is read in conjunction with the drawings, in which:

FIG. 1 is a diagrammatic view of one form of a signal transducing means embodying the invention, FIG. 2 is a diagrammatic view of another form of the signal generating means shown in FIG. 1, FIG. 3 is a hysteresis curve graphically illustrating the magnetic properties of a bistable magnetic device utilized in the invention, and FIGS. 4A to 4F are respective graphs illustrating signals generated by the signal transducing means.

Like reference numerals designate like parts throughout the several views.

FIG. 1 is a diagrammatic view of a signal transducing means 10 embodying the invention. The transducing means 10 comprises a conducting means 12 with portions 16 and 17 for magnetic flux of substantially rectangular configuration providing a circuit 14 shown by the dashed lines and arrows. The portion 16 has four sides 18, 20, 22 and 24. The side 18 receives about it, the winding 26 of an coil which is energized by an oscillator 28 providing an alternating current. The side 20 is provided with an air gap 30 which is adapted to receive a movable member 32 comprising the portion 17 of the conducting means 12 which provides a path for the circuit 14 having a permeance which is alterable. In the form illustrated, the movable member 32 is rotatable as shown by the arrow 34 about a shaft 36. The member 32 has an elongated portion of high permeability extending diagonally to provide two segments with circular ends proximate to complimentarily curved ends of the side 20 forming the air gap 30. The member 32 is provided with a pair of concave intermediate surfaces 40 minimizing its dimension in the direction transverse to its extending direction.

With the member 32 positioned as shown in FIG. 1, a path having maximum permeance is provided for the circuit 14. With the member 32 rotated 90° from its position shown in FIG. 1, its concave portions 40 are respectively positioned opposite the curved ends of the side 20, providing a maximum air space in the path of side 20 and the member 32, thereby providing minimum permeance, and maximum reluctance for magnetic flux in the path of circuit 14. The permeance provided by the member 32 as it rotates from its position shown in FIG. 1, decreases continuously as the extending ends of the member 32 gradually move away from the ends of the side 20 until the minimum value of permeance is attained with the 90° rotation. As the member 32 continues to rotate, the permeance gradually increases until the maximum value is again attained with a 180° rotation of the member 32 from its original position in FIG. 1. Thus, with each complete 360° rotation of the member 32, the circuit 14 has reluctance to magnetic flux along its path varying to achieve two cycles of alternate minimum and maximum values.

The side 22 of the conducting means 12, receives a coupling means 42 for concentrating and subjecting a bistable magnetic device 44 to the magnetic flux of the circuit 14. The coupling means may be any device which directs the flux lines into and about the bistable magnetic device 44, including a plurality of vertically arranged segments of high permeability having an opening therethrough into which the bistable magnetic device 44 is received. The bistable magnetic device 44 is provided with a signal detecting coil 46 wound therealong with output leads for delivering signals generated by the magnetic device 44 with each change in its magnetic state as explained below.

The bistable magnetic device 44 may be of the type described in U.S. Pat. No. 3,820,090 issued on June 25, 1974 and entitled Bistable Magnetic Device. It comprises a wire of generally uniform composition having a central relatively "soft" core portion, and a relatively "hard" magnetized shell portion with relatively high and low coercivities, respectively. Such a wire or device 44 may be made by properly work hardening a homogenous magnetic alloy to provide a relatively hard shell portion of high coercivity with respect to the central core. The device provides a high energy state when its flux extends externally, and a low energy state when its flux is substantially internal. In the low energy state, the flux in the shell has a return path through the core of the device. Switching of the bistable magnetic device 44 occurs when the density of applied external flux passes through a value which causes the external flux to capture the core of the device from its shell. This results in a rapid increase in external flux density known as the "Wiegand Effect." This effect is detected as an output pulse signal by the coil 46. This phenomenon, is also explained in detail in an article entitled "Wiegand Wire: New Material For Magnetic-Based Devices" by Philip E. Wigen in Electronics dated July 10, 1975 and in an article entitled "Wiegand Pulses Break Through Into New Applications" in Canadian Controls & Instrumentation dated December 1977.

The hysteresis curve of FIG. 3 illustrates a magnetic switching characteristic of the bistable magnetic device 44. However, the invention may utilize devices with other switching characteristics such as those illustrated in said U.S. Pat. No. 3,820,090, and the noted article by Philip E. Wigen.

In considering the operation of the bistable magnetic device 44, the upwardly sloping portion 48 of FIG. 3 illustrates a gradual change in magnetic density B of the bistable device 44 with the increase in the applied magnetic field intensity H. When the intensity H reaches the level 50, a rapid change in flux density B occurs, due to the switching of the bistable magnetic means 44. The flux density B which initially has a negative sense rapidly approaches and passes the zero value and increases in the opposite positive sense to a high flux value B shown at 52 in FIG. 3. The rapid upward transitions is illustrated by the substantially vertical portion 54 of the curve. A further increase in the magnetic field intensity H, results in a small increase in flux density B as illustrated by the slope of the line 56. When the magnetic field intensity H is reduced to zero, and then increased in the opposite negative direction, a gradual reduction in flux density B takes place as illustrated by the line 58. When the magnetic field density H reaches the negative value at the point 60, a rapid change in flux density B occurs in the opposite downward direction illustrated by the substantially vertical portion 62 of the curve. The flux density B passes through zero value and increases in he opposite negative direction to the level illustrated at 64. This rapid reversal in flux density B constitutes a second switching action during the hysteresis cycle. An increase in the positive direction of the magnetic field density H results in a decrease in the negative magnetic flux density B as illustrated by the line 48. This starts a new hysteresis cycle. Thus, for each increase and decrease of magnetic field intensity H, the bistable magnetic device 44 rapidly changes its external magnetic flux from a maximum value in one sense to a maximum value in the opposite sense. This results in the coil 46 producing an output signal for each flux reversal, one pulse being positive with respect to the other.

The negative and positive going pulse signals detected by the coil 46 are delivered to an output detector 66 of a signal processing means 68. The output detector 66 produces an output signal for each input signal of the coil 46. The detector 66 delivers its output signals to a bistable or flip-flop circuit 70 for setting it to its second of two states. A signal cross-over detector 71 which is energized by signals from the oscillator 28 produces output signals for resetting the flip-flop circuit 70 to its first state. The flip-flop circuit 70 delivers an enabling signal to a gate 72 when it is in its first state. When enabled the gate 72 delivers pulse signals from a pulse signal generator 74 to a counter 76. The counter 76 is reset to zero count by the output signal from the cross-over detector 71 at the time the flip-flop circuit 70 is set to its first state enabling the gate 72. The counter 76 provides an output signal to a digital to analog converter 78 of the signal processing means 68 for providing an output analog signal.

Refer now to FIGS. 4A to 4F in connection with the following description of the operation of the signal transducing means 10 of FIG. 1. The oscillator 28 applies an alternating signal represented by the curve 80 of FIG. 4A having positive and negative portions 82 and 84. The embodiment of the signal transducing means 10 illustrated in FIG. 1 is most effective for frequencies of the oscillator 28 which are not higher than 60 hertz. The signal transducing means 10 is most effective at low frequencies, since at high frequencies variations in the position of the movable member 32 is not highly effective for changing the reluctance of the circuit 14 and the density of magnetic flux to which the bistable magnetic device 44 is subjected. For higher frequencies another form of circuit which is more effective is described below in connection with FIG. 2.

The alternating magnetic flux induced in circuit 14 by energizing coil 26 is illustrated by the curve 86 in FIG. 4B. For low frequencies the induced flux is substantially in phase with the energizing current as shown. The dashed lines 88 and 90 representing the predetermined flux value $B_t$, illustrate the levels of flux density B in the positive and negative senses, respectively, for triggering the bistable magnetic device 44 to switch from one state to another. As the oscillator signal of curve 80 passes through its zero value, the detector 71 delivers an output signal to the flip-flop circuit 70 setting it to its first state, while the delivery of an output signal by the bistable magnetic device 44 (when the induced magnetic flux applied to it passes through the value $B_t$) returns the flip-flop 72 to its reset second state. This action provides the gate enabling signals 92 of controlled duration illustrated by the solid line square waves in FIG. 4C. The signals 92 are delivered to gate 72 by the flip-flop 70 resulting in delivery of the pulse signals from the pulse generator 74 to the counter 76. The high frequency pulse signals 94 of the generator 74 are shown in FIG. 4D, while groups of the high frequency pulse signals 94 which are passed by the gate circuits 72 to the counter 76 are illustrated by the pulses 94' in FIG. 4E. FIG. 4F shows the form of the analog output signal 96 delivered by the digital to analog converter 78 having an amplitude which increases with the count of the pulses 94' corresponding to the count of the counter 76. The output signal 96 may also be provided by a simple integrating circuit which may be of the type utilizing a capacitor storage element.

Since the reluctance of the magnetic flux circuit 14 varies with the movement or rotary motion of the member 32, the dashed curve 86' of FIG. 4B illustrates the condition when the reluctance is increased to its maximum value. At this time, the flux density B to which the bistable magnetic device 44 is subject, has its peak values reduced to the point where they just exceed the triggering value $B_t$. With the reduction in wave amplitude, the triggering value $B_t$ is reached after a greater delay during the cycle. This results in the bistable magnetic device 44 switching state at a later time, thereby, producing a delayed output signal by the detecting coil 46. Since the flip-flop circuit 70 is set to its first gating state with the delivery of a cross-over signal by detector 71, the delay in delivery of the reset pulse by the output detector 66 provides an output pulse 92' of extended duration. This is illustrated by the dashed lines in FIG. 4C for the pulse 92'. The pulse 92' of longer duration allows a larger number of pulse signals 94 to be gated through from the generator 74 to the counter 76 resulting in a corresponding larger count. In this manner the count recorded by the counter 76 varies in response to the position of the member 32. The output signals from the transducer 10, thus, are directly related to the position or rotary displacement of the member 32. If a spiral spring is secured with a shaft 36 of the member 32, the application of a torque force will provide output signals corresponding to the force exerted. In this manner, the device 10 may be utilized for receiving input signals corresponding to a position, displacement, and force, while providing related electrical output signals.

The output signals of the signal processing means 68 may be delivered in various forms. Thus, for example, the processing means 68 has an output line 98 which provides groups of output pulse signals corresponding to the input signals received which are useful for digital signal processing, while its line 100 delivers output signals from the counter 76 which may be in digital form, while the output line 102 delivers corresponding analog signals from the digital to analog converter 78. The signal transducing means 10, thus, receives input signals in mechanical form which may be representative of different parameters, while providing highly accurate electrical signals for utilization in various forms. The high sensitivity of the transducing means provides output signals of high amplitude and reliability even when low amplitude input signals are received.

FIG. 2 illustrates in diagrammatic form a signal transducing means 104 which is a modified form of the transducing means 10. In view of the similarities between the devices 10 and 104, a description will be given in detail of the differences. The means 104 is most effective when the frequency of the energizing signal provided by the oscillator 28 is greater than 60 hertz for reasons which will become more apparent in connection with the description of this embodiment.

The conducting means 12' includes a portion 16' having sides 106, 108, 110 and 112 having a high permeability, as provided by ferromagnetic materials. The portion 16' also includes an intermediate section 114 of high permeability extending perpendicularly between the sides 108 and 112. The side 110 has an air gap 116 of lower permeability, which receives into it a second portion 118 in the form of a wedge shaped member 120 of high permeability. The member 120 is movable into and out of the gap 116 in the direction of the arrows 122 for varying the permeance of the path through the gap 116. The section 114 of the portions 16' is provided with the flux coupling means 42, bistable magnetic device 44, and detecting coil 46.

The conducting means 12', by its arrangement, provides paths for magnetic flux induced by the energizing coil 26 along a circuit 124 illustrated by the dashed lines and arrows. The circuit 124 extends in the conducting means 12' in the counter clockwise direction along the side 106 partly along the side 108, the side 114 through the coupling means 42 and bistable magnetic device 44, and returning to the side 106 along part of the side 112. A second magnetic flux path is provided by the circuit 126 in the directions shown by the dashed lines and arrows extending along the sides 106 and 108, along side 110 through its gap 116 and member 120, and returning along the side 112 to the side 106 of the portion 16'.

The signal transducing means 104, thus, provides two circuits 124 and 126 for magnetic flux which follows the same paths except where they separate to provide individual flux paths through the second portion 118 in the side 110 and the bistable magnetic device 44 in the intermediate section 114 forming parallel circuit portions.

In operation, the signal transducing means 104 is energized by a signal from an oscillator 28, which is also represented by the curve 80 in FIG. 4A. As noted previously, the oscillator signal 80 may have a frequency higher than 60 Hz. For such higher signals, the magnetic flux induced in the conducting means 12' may be represented by curves 86 and 86' as illustrated in FIG. 4B. However, as the frequency of the oscillator 28 increases, the phase of the induced magnetic flux is delayed up to a phase shift of 90°. This of course, also delays the delivery of output signals by the detecting coil 46 with respect to the cross-over point of the oscillator signal 80, and results in a gating signal to the gate 72 of longer duration.

At higher frequencies, it has also been found, that the increase and decrease in permeance caused by the member 120 in the circuit 126, while affecting the flux in the circuit 124 applied to the bistable magnetic device 44, does not effect the total flux produced by the energizing coil 26 for the circuits 124 and 126 combined. Thus, an increase in permeance resulting from the narrowing of the gap 116 by movement of a member 120 into the gap, provides an increase in flux in circuit 126 and a corresponding decrease in flux in the circuit 124. Conversely, the movement of the member 120 out of the gap 116 provides an increase in the reluctance in the circuit 126 and decrease in the flux in circuit 126 accompanied by a corresponding increase in the circuit 124.

The changes in flux, thus resulting in circuit 124, are applied to the bistable magnetic device 44. In this manner, movement of the member 120 to the left, produces a reduced flux applied to the bistable magnetic device 44 as represented by the curve 86' in FIG. 4B. This change, as explained in connection with the magnetic transducing means 10, controls the duration of the gating signal to the gate 72, resulting in delivery of output signals on lines 98, 100 and 102 of the signal processing means 68, which are responsive to the position of the member 120.

As also noted in connection with the rotary member 32 of the transducing means 10 of FIG. 1, the movement of the member 120 provides a mechanical input to the transducing device 104 which is represented electrically by the output signals of the signal processing means 68. The member 120, as illustrated in FIG. 2, may be actuated and positioned by connection through a rod 132 to the diaphragm 128 of a body 130 containing a vacuum. The mechanical input signal represented by the displacement of the member 120, thus can provide an output signal providing an electrical indication of atmospheric pressure. The positioning and displacement of the member 120, in a similar manner, may provide inputs representative of different parameters for providing electrical output signals as described in connection with the signal transducing means 10 and affording the advantages noted in connection therewith.

Although several embodiments of the invention have been described in detail, it will be obvious to those skilled in the art that the invention disclosed may be modified to meet particular design circumferences, without substantial departure from the essence of the invention.

What is claimed is:

1. A signal transducing means for receiving input signals and delivering output signals comprising a bistable magnetic device which alters its magnetic state when the density of magnetic flux to which it is subject passes through a predetermined value, detecting means providing an output signal responsive to a change in magnetic state of said bistable device, conducting means for magnetic flux for subjecting said bistable magnetic device to conducted magnetic flux, said conducting means comprising a first portion providing a path of high permeability and a second portion providing a path having a permeance which is alterable in response to said input signals for varying the reluctance of said conducting means and the density of magnetic flux to which said bistable device is subject, and an energizing means for providing a time varying magnetic field for inducing magnetic flux in said conducting means and providing a flux density which varies through said predetermined value for altering the state of said bistable device to provide an output signal by said detecting means which is controlled by the variation of reluctance of said conducting means.

2. The means of claim 1 in which the path of the second portion of said conducting means includes a movable member adapted for being actuated in response to input signals for varying the reluctance of said conducting means.

3. The means of claim 2 in which the path of the second portion of said conducting means includes a gap of reduced permeability movably receiving therein said member which provides a path of high permeability for varying the reluctance of said conducting means.

4. The means of claim 3 in which said member is movable between first and second positions for varying the reluctance provided by said second portion between minimum and maximum values.

5. The means of claim 3 in which said member is rotatable for periodically varying the reluctance provided by said second portion.

6. The means of claim 4 in which said member includes an element having a configuration providing a minimum value of reluctance and a path of maximum permeance for the flux through said gap of said second portion when said member is in its first position, and providing a maximum value of reluctance and a path of minimum permeance for magnetic flux through said gap when said member is in its second position, the element of said member providing reluctance values varying between said minimum and maximum values as a continuous function of the position of said member between its first and second positions.

7. The means of claim 6 in which said energizing means includes an energizing coil wound about the first portion of said conducting means and an energizing source providing alternating current to said coil, the peak value of the alternating current provided to said coil being sufficient for periodically subjecting said bistable device to said predetermined value of flux density to alter its magnetic state and for said detecting means to provide corresponding output signals.

8. The means of claim 7 in which ferromagnetic material provides the path of high permeability and air provides the path of reduced permeability of said conducting means, the first and the second portions are arranged to provide a series path for the magnetic flux induced by said coil, and said bistable device is subject to the magnetic flux in the path of the first portion of said conducting means.

9. The means of claim 7 in which includes a signal processing means which receives signals from said energizing means and from said detecting means and provides output signals responsive to received input signals.

10. The means of claim 1 in which said conducting means has a third portion providing a path of high permeance, and includes a first circuit for magnetic flux comprising said first and second portions of said conducting means, and a second circuit for magnetic flux comprising said first and third portions of said conducting means, said energizing means induces magnetic flux in the first and second circuits of said conducting means, and said bistable device is subject to the magnetic flux of the third portion of the second circuit of said conducting means.

11. The means of claim 10 in which the path of the second portion of said first circuit is provided with a movable member adapted for being actuated in response to input signals for varying the reluctance of its circuit.

12. The means of claim 11 in which the path of the second portion of said conducting means includes a gap of reduced permeability movably receiving therein said member which provides a path of high permeability for varying the reluctance of said conducting means.

13. The means of claim 12 in which said member is movable between first and second positions for varying the reluctance provided by said second portion between respective minimum and maximum values.

14. The means of claim 12 in which said member is rotatable for periodically varying the reluctance provided by said second portion.

15. The means of claim 13 in which said member includes an element of high permeability providing an minimum value of reluctance and a path of maximum permeance for magnetic flux through said gap of said second portion when said member is in its first position, and providing a maximum value of reluctance and a path of minimum permeance for magnetic flux through said gap when said member is in its second position, the element of said member providing reluctance values varying between said minimum and maximum values as a continuous function of the position of said member between its first and second positions, increases and decreases in reluctance of the first circuit caused by said member provide corresponding decreases and increases of its magnetic flux and result in respective increases and decreases of magnetic flux in the second circuit to which the bistable device is subject.

16. The means of claim 15 in which said energizing means includes an energizing coil wound about the first portion of said conducting means and an energizing source providing alternating current to said coil, the peak value of the alternating current provided to said coil being sufficient for periodically subjecting said bistable device to said predetermined value of flux density to alter its magnetic state and for said detecting means to provide corresponding output signals.

17. The means of claim 16 in which ferromagnetic material provides the paths of high permeability and air provides the path of reduced permeability of said conducting means, the first and the second portions are arranged to provide a series path for the magnetic flux induced by said coil in the first circuit while the first and third portions are arranged to provide a series path for magnetic flux induced in said second circuit, the flux of the first portion being substantially independent of variation in the reluctance of said first circuit, and said bistable device is subject to the magnetic flux in the path of the third portion of said conducting means.

18. The means of claim 16 which includes a signal processing means which receives signals from said energizing means and from said detecting means and provides output signals responsive to received input signals.

19. The means of claim 1 in which said energizing means includes an energizing coil wound about the first portion of said conducting means and an energizing source providing alternating current to said coil, the peak value of the alternating current provided to said coil being sufficient for periodically subjecting said bistable device to said predetermined value of flux density to alter its magnetic state and for said detecting means to provide corresponding output signals.

20. The means of claim 19 which includes a signal processing means which receives signals from said energizing means and from said detecting means and provides output signals responsive to received input signals.

21. The means of claim 20 in which said signal processing means includes a bistable means periodically set to a first state by the signal from said energizing means and reset to its second state upon receipt of a signal from said detecting means.

22. The means of claim 21 in which said signal processing means includes a gating means and pulse generating means, said gating means being enabled by a signal received from said bistable means when it is in its first state for passing pulse signals from said pulse generating means to a signal storing means.

23. The means of claim 22 in which said processing means includes a signal cross-over detector receiving alternating signals from said energizing means and delivering output signals to said bistable means for setting it to its first state, an output detector for receiving signals from said bistable device for resetting said bistable magnetic means to its second state, and said signal storing means receiving pulse signals from said gating means and providing output signals.

24. The means of claim 23 in which the path of the second portion of said conducting means includes a member which is movable in response to input signals, and said signal processing means include signal converting output means responsive to said signals from said storing means for providing converted output signals in response to input signals.

25. The means of claim 24 in which said signal storing means of said signal processing means comprises a digital counter providing a digital output signal, and said signal converting means is a digital to analog converter for providing an analog output signal.

* * * * *